(12) United States Patent
Ahn et al.

(10) Patent No.: US 7,768,853 B2
(45) Date of Patent: Aug. 3, 2010

(54) SEMICONDUCTOR MEMORY DEVICE

(75) Inventors: Hyo-Joo Ahn, Seoul (KR); Kyu-Chan Lee, Seoul (KR); Chul-Woo Yi, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 191 days.

(21) Appl. No.: 12/079,995

(22) Filed: Mar. 31, 2008

(65) Prior Publication Data

US 2008/0298111 A1    Dec. 4, 2008

(30) Foreign Application Priority Data

Jun. 1, 2007  (KR) ...................... 10-2007-0053990

(51) Int. Cl.
    *G11C 7/00*   (2006.01)
(52) U.S. Cl. .................. 365/203; 365/63; 365/154; 365/205
(58) Field of Classification Search .................. 365/203, 365/205, 63, 154
    See application file for complete search history.

(56) References Cited

U.S. PATENT DOCUMENTS

| | | | | |
|---|---|---|---|---|
| 6,201,728 | B1 * | 3/2001 | Narui et al. ................. | 365/149 |
| 7,088,628 | B2 * | 8/2006 | Lee et al. ..................... | 365/205 |
| 2006/0256625 | A1 * | 11/2006 | Kajitani et al. ......... | 365/189.01 |
| 2007/0036008 | A1 | 2/2007 | Park et al. | |
| 2007/0109904 | A1 | 5/2007 | Hong et al. | |

FOREIGN PATENT DOCUMENTS

| | | |
|---|---|---|
| JP | 2004103119 | 4/2004 |
| KR | 1020010081704 A | 8/2001 |
| KR | 10-2006-0082941 | 7/2006 |
| KR | 100621554 B1 | 8/2006 |
| KR | 10-0655375 | 12/2006 |
| KR | 10-2007-0039804 A | 4/2007 |

* cited by examiner

*Primary Examiner*—Son Dinh
(74) *Attorney, Agent, or Firm*—Mills & Onello, LLP

(57) ABSTRACT

A semiconductor memory device includes: a substrate with first and second memory-cell array regions disposed on first and second substrate sides and first and second sense-circuit regions disposed on the first and second substrate sides between the first and second memory-cell array regions; first and second bitlines coupled to a plurality of memory cells in the first memory-cell array region; first and second complementary bitlines coupled to a plurality of memory cells in the second memory-cell array region; first and second column-selection transistors formed in the first sense-circuit region, and selectively couple the first bitline and the first complementary bitline to a first input/output (I/O) line and a first complementary I/O line; and third and fourth column-selection transistors formed in the second sense-circuit region, and selectively couple the second bitline and the second complementary bitline to a second I/O line and a second complementary I/O line.

22 Claims, 11 Drawing Sheets

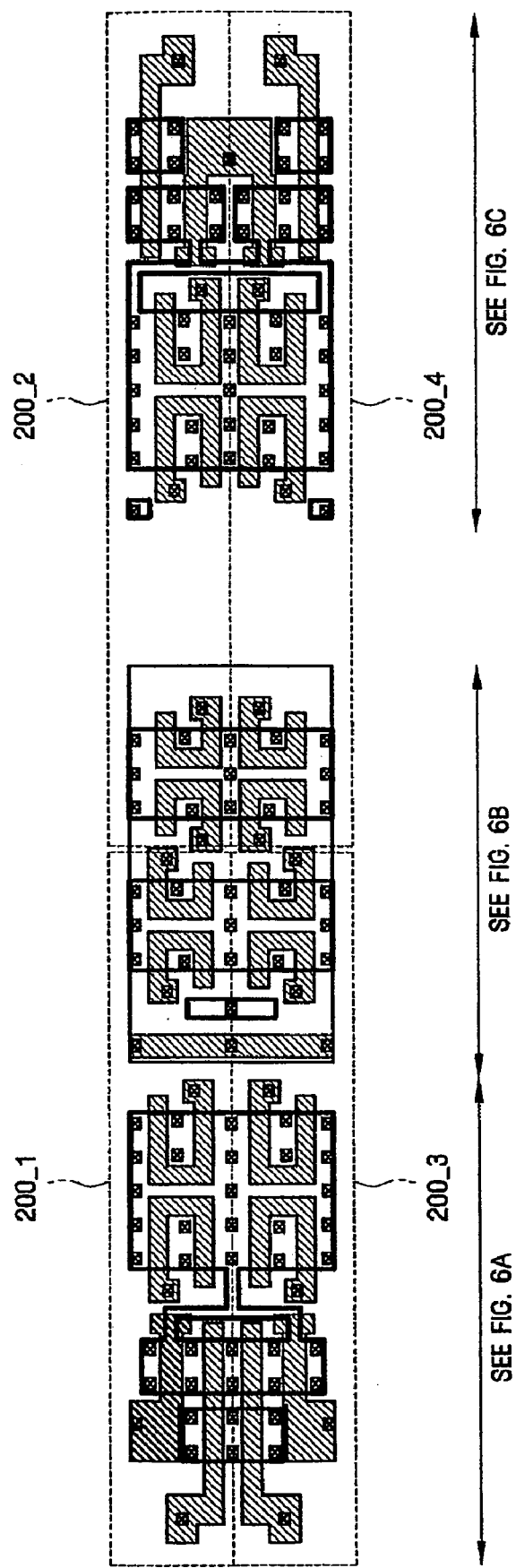

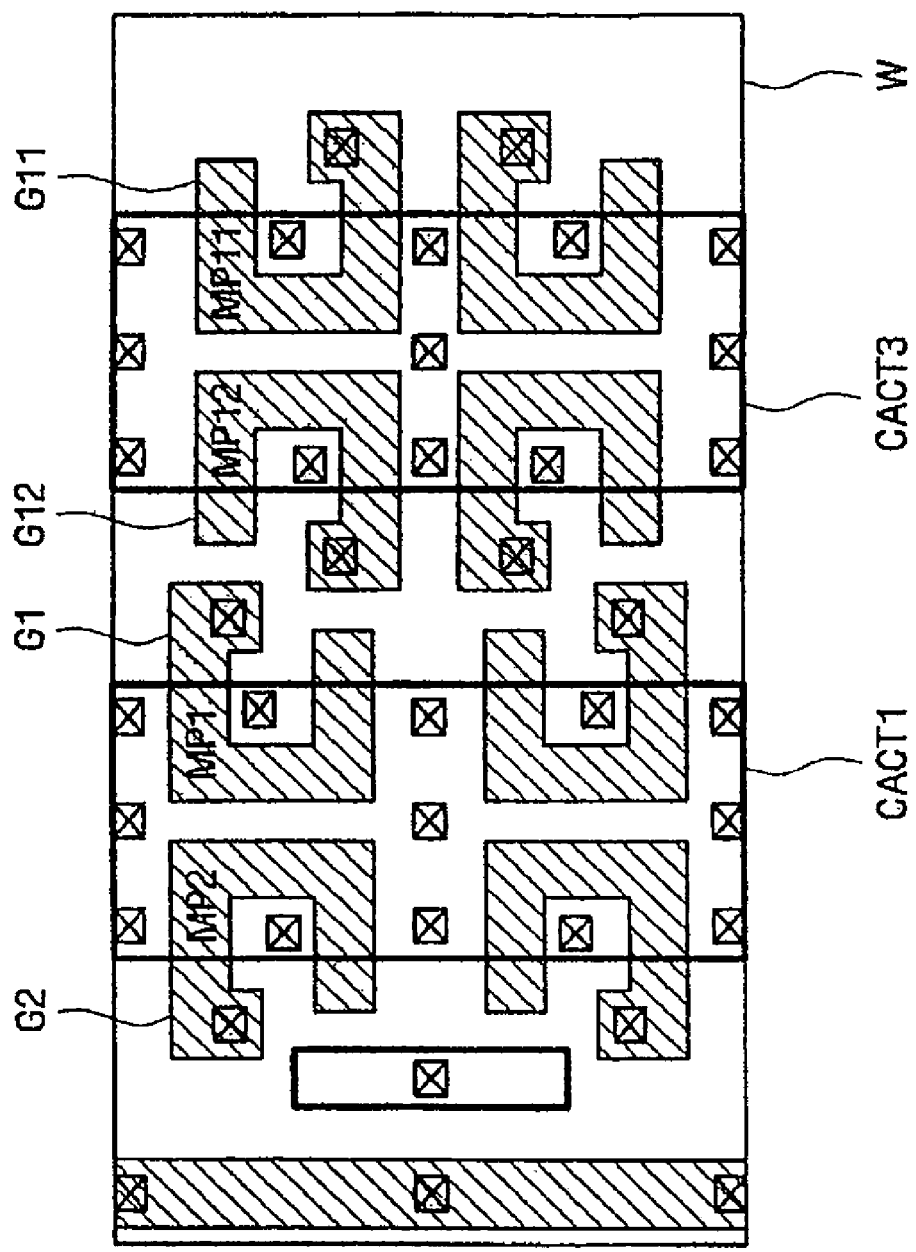

SEMICONDUCTOR MEMORY DEVICE

CROSS-REFERENCE TO RELATED APPLICATION

This application claims priority under 35 U.S.C. §119 to Korean Patent Application No. 10-2007-0053990 filed on Jun. 1, 2007 in the Korean Intellectual Property Office, the disclosure of which is incorporated herein by reference in its entirety.

BACKGROUND OF THE INVENTION

1. Field of the Invention

The present invention relates to a semiconductor memory device, and, more particularly, to a semiconductor memory device having an open bitline structure.

2. Description of the Related Art

Conventionally, semiconductor memory devices have been designed using a folded bitline structure. In the folded bitline structure, a bitline and a complementary bitline are both disposed in the same memory-cell array region, which causes the same amount of coupling noise between the bitline and a wordline as that generated between the complementary bitline and the wordline. This type of common mode noise can be easily removed by performing differential amplification using a sense amplifier. However, since there is a limit in reducing the size of memory cells using the folded bitline structure, research is being conducted on an open bitline structure in an effort to increase the integration density of semiconductor memory devices.

SUMMARY OF THE INVENTION

According to an aspect of the present invention, there is provided a semiconductor memory device including: a substrate on which first and second memory-cell array regions and first and second sense-circuit regions are defined, the first memory-cell array region being disposed on a first side of the substrate, the second memory-cell array region being disposed on a second side of the substrate, the first and second sense-circuit regions being disposed between the first and second memory-cell array regions, the first sense-circuit region being disposed on the first side, and the second sense-circuit region being disposed on the second side; first and second bitlines coupled to a plurality of memory cells in the first memory-cell array region; first and second complementary bitlines coupled to a plurality of memory cells in the second memory-cell array region; first and second column-selection transistors formed in the first sense-circuit region, and configured to selectively couple the first bitline and the first complementary bitline to a first input/output (I/O) line and a first complementary I/O line; and third and fourth column-selection transistors formed in the second sense-circuit region, and configured to selectively couple the second bitline and the second complementary bitline to a second I/O line and a second complementary I/O line.

According to another aspect of the present invention, there is provided a semiconductor memory device including: a substrate on which first and second memory-cell array regions and first and second sense-circuit regions are defined, the first memory-cell array region being disposed on a first side of the substrate, the second memory-cell array region being disposed on a second side of the substrate, the first and second sense-circuit regions being disposed between the first and second memory-cell array regions, the first sense-circuit region being disposed on the first side, and the second sense-circuit region being disposed on the second side; first and second bitlines coupled to a plurality of memory cells in the first memory-cell array region; first and second complementary bitlines coupled to a plurality of memory cells in the second memory-cell array region; a first sense amplifier, formed in the first sense-circuit region, includes a plurality of sensing transistors of a first conductivity type configured to amplify a difference between a voltage of the first bitline and a voltage of the first complementary bitline; and a second sense amplifier, formed in the second sense-circuit region, includes a plurality of sensing transistors of the first conductivity type configured to amplify a difference between a voltage of the second bitline and a voltage of the second complementary bitline, wherein the first sense amplifier and the second sense amplifier are both formed in a well of a second conductivity type.

According to another aspect of the present invention, there is provided a semiconductor memory device including: a substrate on which first and second memory-cell array regions and first and second sense-circuit regions are defined, the first memory-cell array region being disposed on a first side of the substrate, the second memory-cell array region being disposed on a second side of the substrate, the first and second sense-circuit regions being disposed between the first and second memory-cell array regions, the first sense-circuit region being disposed on the first side, and the second sense-circuit region being disposed on the second side; first and second bitlines coupled to a plurality of memory cells in the first memory-cell array region; first and second complementary bitlines coupled to a plurality of memory cells in the second memory-cell array region; a first sense amplifier including a plurality of sensing transistors of a first conductivity type formed in a first common active region in the first sense-circuit region, the first sense amplifier configured to amplify a difference between a voltage of the first bitline and a voltage of the first complementary bitline; and a second sense amplifier including a plurality of sensing transistors of the first conductivity type formed in a second common active region in the second sense-circuit region, the second sense amplifier configured to amplify a difference between a voltage of the second bitline and a voltage of the second complementary bitline.

According to another aspect of the present invention, there is provided a semiconductor memory device including: a bitline; a complementary bitline; a voltage line; a sense amplifier including a first sensing transistor that is coupled between the bitline and the voltage line and a second sensing transistor that is coupled between the complementary bitline and the voltage line; and an equalizer including a first equalizing transistor that is coupled between the bitline and the voltage line, and a second equalizing transistor that is coupled between the complementary bitline and the voltage line.

BRIEF DESCRIPTION OF THE DRAWINGS

The above and other aspects and features of the present invention will become apparent by describing in detail exemplary embodiments thereof with reference to the attached drawings, in which:

FIG. 5 illustrates the active regions, the well, a plurality of gates, and a plurality of contacts of the semiconductor memory device illustrated in FIG. 3;

FIGS. 6A through 6C are detailed diagrams of FIG. 5;

DETAILED DESCRIPTION OF THE EXEMPLARY EMBODIMENTS

Figure 1:
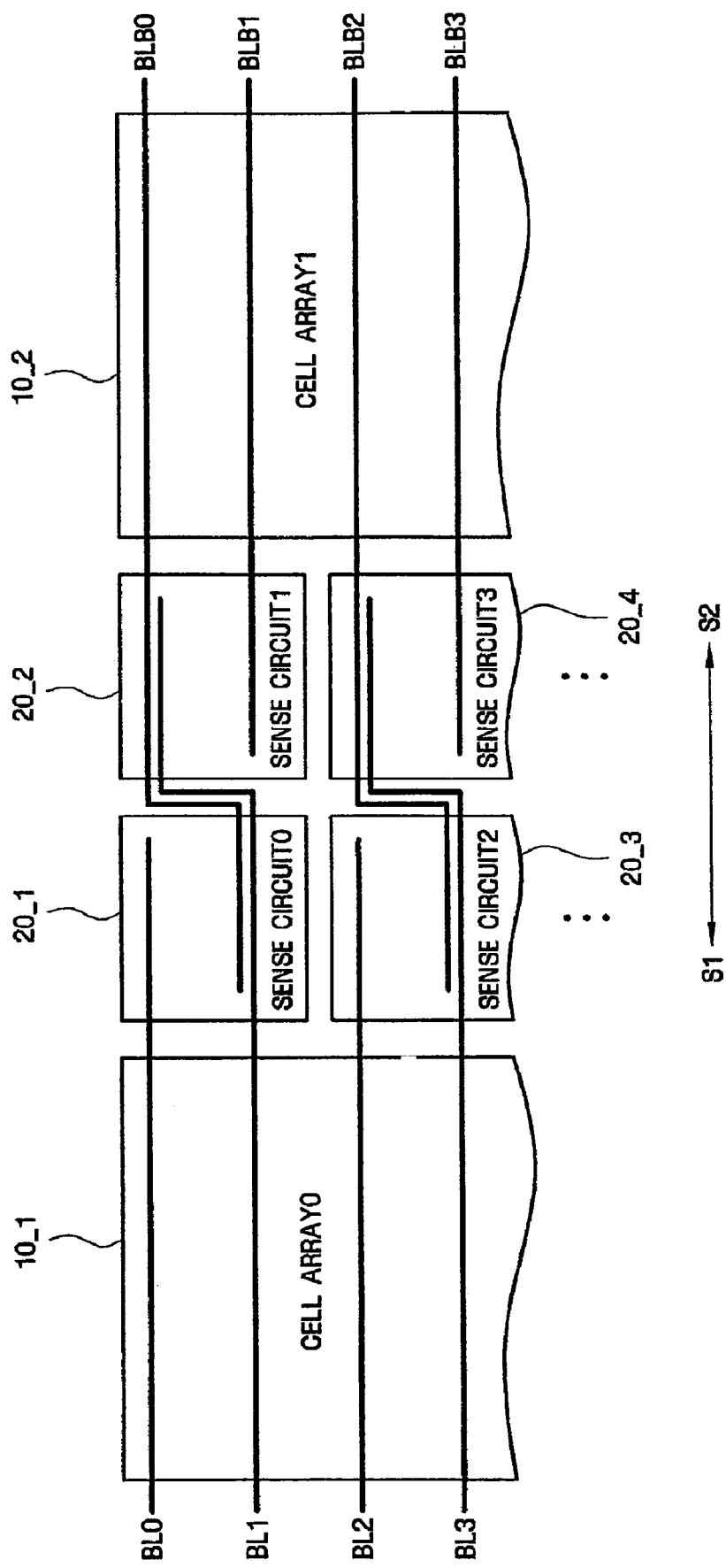
FIG. 1 is a conceptual diagram of an embodiment of a semiconductor memory device according to aspects of the present invention.

Aspect of the present invention will now be described more fully with reference to the accompanying drawings, in which exemplary embodiments in accordance with the invention are shown. The invention may, however, be embodied in many different forms and should not be construed as being limited to the embodiments set forth herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to limit the invention. As used herein, the singular forms "a" "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Furthermore, relative terms such as "below," "beneath," or "lower," "above," and "upper" may be used herein to describe one element's relationship to another element as illustrated in the accompanying drawings. It will be understood that relative terms are intended to encompass different orientations of the device in addition to the orientation depicted in the accompanying drawings. For example, if the device in the accompanying drawings is turned over, elements described as being on the "lower" side of other elements would then be oriented on "upper" sides of the other elements. Similarly, if the device in one of the figures is turned over, elements described as "below" or "beneath" other elements would then be oriented "above" the other elements. Therefore, the exemplary terms "below" and "beneath" can, therefore, encompass both an orientation of above and below.

FIG. 1 is an embodiment of a conceptual diagram of a semiconductor memory device according to an aspect of the present invention. Referring to FIG. 1, the semiconductor memory device includes first and second memory cell arrays 10_1 and 10_2 and first through fourth sense-circuits 20_1 through 20_4. For convenience, FIG. 1 illustrates only four sense-circuit, but the present invention is not restricted to this number. That is, the semiconductor memory device can include more than four sense circuits, if necessary.

Referring to FIG. 1, the semiconductor memory device has an open bitline structure. Bitlines BL0 through BL3 belong to a different memory cell array than complementary bitlines BLB0 through BLB3. Specifically, the bitlines are coupled to a plurality of memory cells (not shown) in the first memory-cell array region 10_1, and complementary bitlines BLB0 through BLB3 are coupled to a plurality of memory cells (not shown) in the second memory cell array 10_2.

The first through fourth sense circuits 20_1 through 20_4 are circuits configured for sensing data stored in the first and second cell arrays 10_1 and 10_2, respectively. In order to perform such sensing operations, each of the first through fourth sense circuits 20_1 through 20_4 can include a P-type sense amplifier, an N-type sense amplifier, an equalizer, and a column selector. Specifically, the first sense circuit 20_1 is coupled to the bitline BL0 and the complementary bitline BLB0, and senses data stored in a number of memory cells which are coupled to the bitline BL0 or the complementary bitline BLB0. The second sense circuit 20_2 is coupled to the bitline BL1 and the complementary bitline BLB1, and senses data stored in a number of memory cells which are coupled to the bitline BL1 or the complementary bitline BLB1. The third sense circuit 20_3 is coupled to the bitline BL2 and the complementary bitline BLB2, and senses data stored in a number of memory cells which are coupled to the bitline BL2 or the complementary bitline BLB2. The fourth sense circuit 20_4 is coupled to the bitline BL3 and the complementary bitline BLB3, and senses data stored in a number of memory cells which are coupled to the bitline BL3 or the complementary bitline BLB3.

When the first memory cell array 10_1 is disposed on a first side S1 (e.g., on a left side) of the substrate and the second memory cell array is disposed on a second side S2 (e.g., on a right side) of the substrate, the first through fourth sense circuits 20_1 through 20_4 are disposed between the first memory cell array 10_1 and the second memory cell array 10_2, the first and third sense circuits 20_1 and 20_3 are disposed on the first side S1, and the second and fourth sense circuits 20_2 and 20_4 are disposed on the second side S2.

The structure and operation of the semiconductor memory device illustrated in FIG. 1 will hereinafter be described in further detail with reference to FIGS. 2 through 9.

Figure 2:
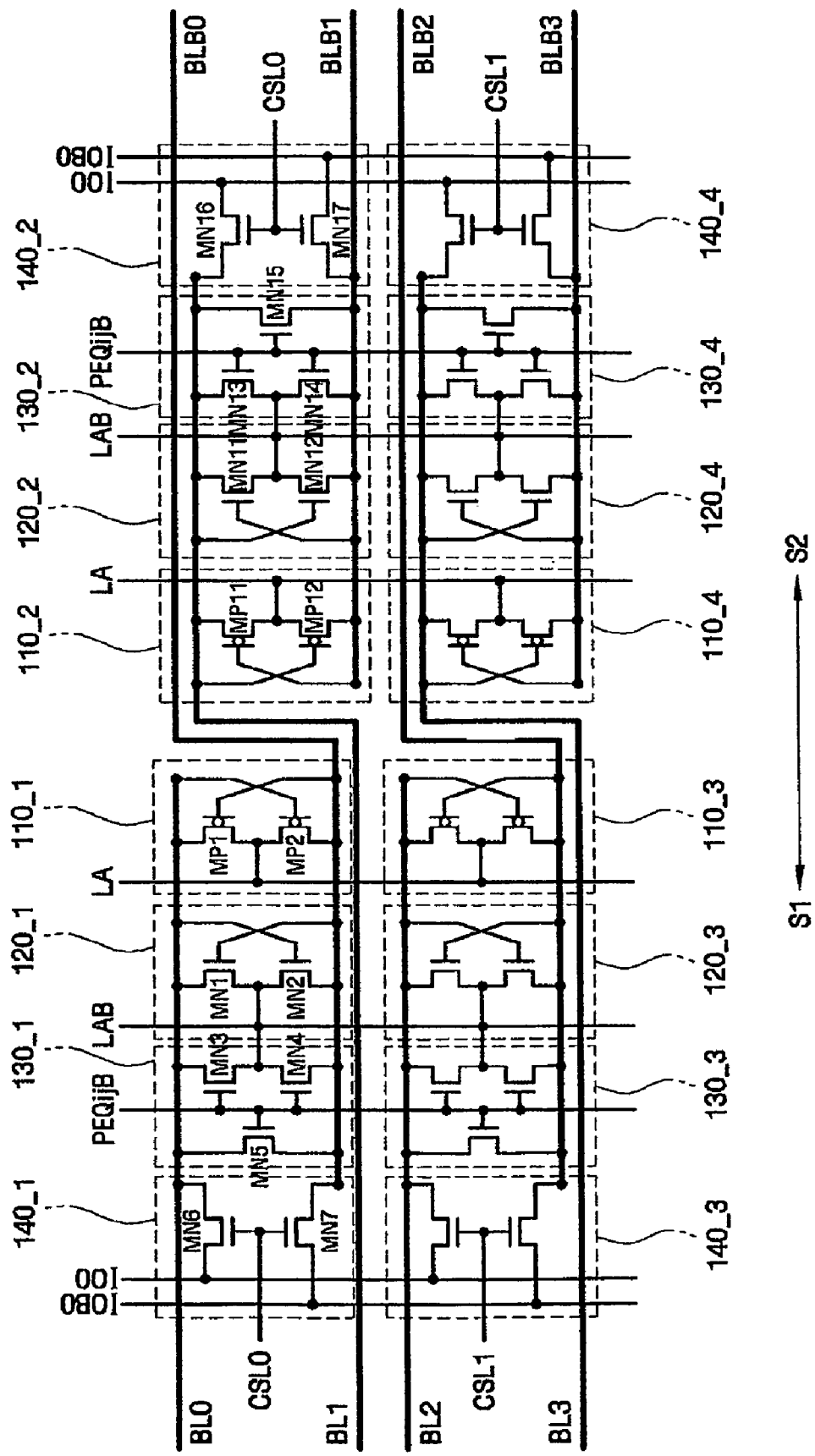
FIG. 2 is a circuit diagram of an embodiment of a plurality of sense-circuit regions in a semiconductor memory device according to an aspect of the present invention.

FIG. 2 is a circuit diagram of an embodiment of the first through fourth sense circuits 20_1 through 20_4 illustrated in FIG. 1. Referring to FIG. 2, the first through fourth sense circuits 20_1 through 20_4 include P-type sense amplifiers 110_1 through 110_4, respectively, N-type sense amplifiers 120_1 through 120_4, respectively, equalizers 130_1 through 130_4, respectively, and column selectors 140_1 through 140_4, respectively.

The P-type sense amplifiers 110_1 through 110_4 and the N-type sense amplifiers 120_1 through 120_4 can be collectively referred to as bitline sense amplifiers. The bitline sense amplifiers 110_1 through 110_4 and 120_1 through 120_4 sense differences between the voltages of the bitlines BL0 through BL3 and the voltages of the complementary bitlines BLB0 through BLB3.

Specifically, a P-type sense amplifier (e.g., the P-type sense amplifier 110_1) disposed on the first side S1 can include a sensing transistor MP1 of a first conductivity type (e.g., a P-type) which is coupled between the bitline BL0 and a voltage line LA and is turned on or off according to the voltage of the complementary bitline BLB0, and a sensing transistor MP2 of the first conductivity type which is coupled between the complementary bitline BLB0 and the voltage line LA is turned on or off according to the voltage of the bitline BL0. An N-type sense amplifier (e.g., the N-type sense amplifier 120_1) disposed on the first side S1 can include a sensing transistor MN1 of a second conductivity type (e.g., an N-type), which is coupled between the bitline BL0 and a voltage line LAB and is turned on or off according to the voltage of the complementary bitline BLB0, and a sensing transistor MN2 of the second conductivity type which is coupled between the complementary bitline BLB0 and the voltage line LAB and is turned on or off according to the voltage of the bitline BL0. Likewise, a P-type sense amplifier (e.g., the P-type sense amplifier 110_2) disposed on the second side S2 can include sensing transistors MP11 and MP12 of the first conductivity type. An N-type sense amplifier (e.g., the N-type sense amplifier 120_2) disposed on the second side S2 can include sensing transistors MN11 and MN12 of the second conductivity type.

The equalizers 130_1 through 130_4 precharge the bitlines BL0 through BL3 and the complementary bitlines BLB0 through BLB3 to a predetermined voltage. Since the equalizers 130_1 through 130_4 are coupled to the voltage line LAB, the equalizers 130_1 through 130_4 can precharge the bitlines BL0 through BL3 and the complementary bitlines BLB0 through BLB3 to the voltage of the voltage line LAB. The voltage of the voltage line LAB can be VINT/2. Since the equalizers 130_1 through 130_4 and the N-type sense amplifiers 120_1 through 120_4 are all coupled to the voltage line LAB, the layout area of a semiconductor memory device can be reduced compared to the situation when the equalizers 130_1 through 130_4 are coupled to a different voltage line than the N-type sense amplifiers 120_1 through 120_4 (this will become apparent by referencing FIGS. 5 and 6A through 6C).

The equalizers 130_1 through 130_4 and the N-type sense amplifiers 120_1 through 120_4 are illustrated in FIG. 2 as being coupled to the voltage line LAB. However, the equalizers 130_1 through 130_4 and the N-type sense amplifiers 120_1 through 120_4 can all be coupled to the voltage line LA, instead of the voltage line LAB.

Specifically, an equalizer (e.g., the equalizer 130_1) disposed on the first side S1 can include an equalizing transistor MN3 of the second conductivity, which is coupled between the bitline BL0 and the voltage line LAB, an equalizing transistor MN4 of the second conductivity type, which is coupled between the complementary bitline BLB0 and the voltage line LAB, and an equalizing transistor MN5 of the second conductivity type, which is coupled between the bitline BL0 and the complementary bitline BLB0. The equalizing transistors MN3, MN4, and MN5 are all turned on in response to an equalizing signal PEQijB. Likewise, an equalizer (e.g., the equalizer 130_2) disposed on the second side S2 can include equalizing transistors MN13, MN14, and MN15 of the second conductivity type.

The column selectors 140_1 through 140_4 selectively couple the bitlines BL0 through BL3 and the complementary bitlines BLB0 through BLB3 to input/output (I/O) lines IO0 and IO1 and complementary I/O lines IOB0 and IOB1.

Specifically, a column selector (e.g., the column selector 140_1) disposed on the first side S1 can include a column-selection transistor MN6 of the second conductivity type, which is coupled between the bitline BL0 and the I/O line IO0, and a column-selection transistor MN7 of the second conductivity type, which is coupled between the complementary bitline BLB0 and the complementary I/O line IOB0. Likewise, a column selector (e.g., the column selector 140_2) disposed on the second side S2 can include column-selection transistors MN16 and MN17 of the second conductivity type.

The column selectors 140_1 and 140_2, which are disposed on the first side S1 and the second side S2, respectively, can be driven by being provided with a column selection signal CSL0. That is, a sense circuit (e.g., the sense circuit 20_1) disposed on the first side S1 and a sense circuit (e.g., the sense circuit 20_2) disposed on the second side S2 can be driven at the same time, and can thus output data at the same time.

An embodiment of the layout of a plurality of sense-circuit regions of a semiconductor memory device according to an aspect of the present invention will hereinafter be described in further detail with reference to FIGS. 2 through 9, focusing mainly on first and second sense-circuit regions. However, it should be apparent to one of ordinary skill in the art that detailed descriptions of the first and second sense-circuit regions can directly apply to third and fourth sense-circuit regions.

Figure 3:
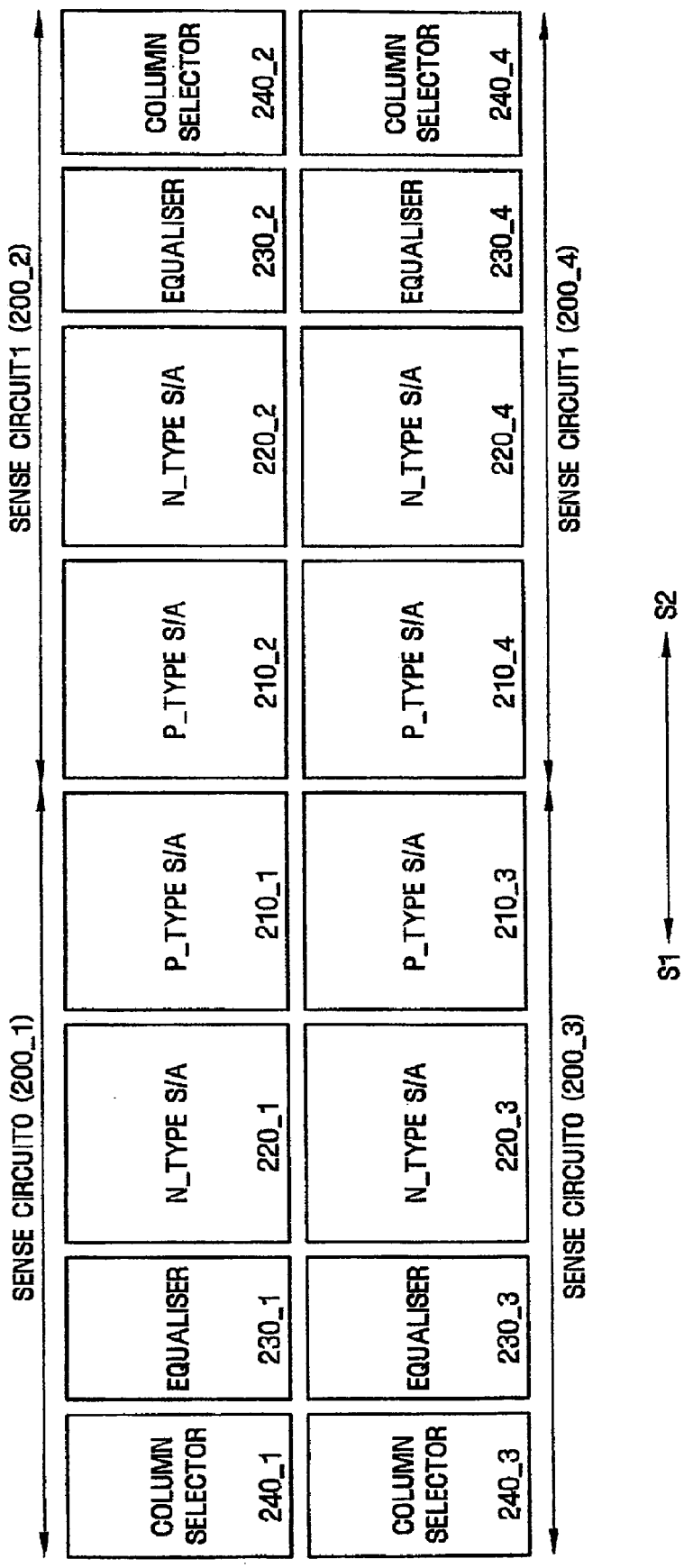
FIG. 3 is a conceptual arrangement diagram of an embodiment of a plurality of sense-circuit regions of a semiconductor memory device according to an aspect of the present invention.
Figure 4:
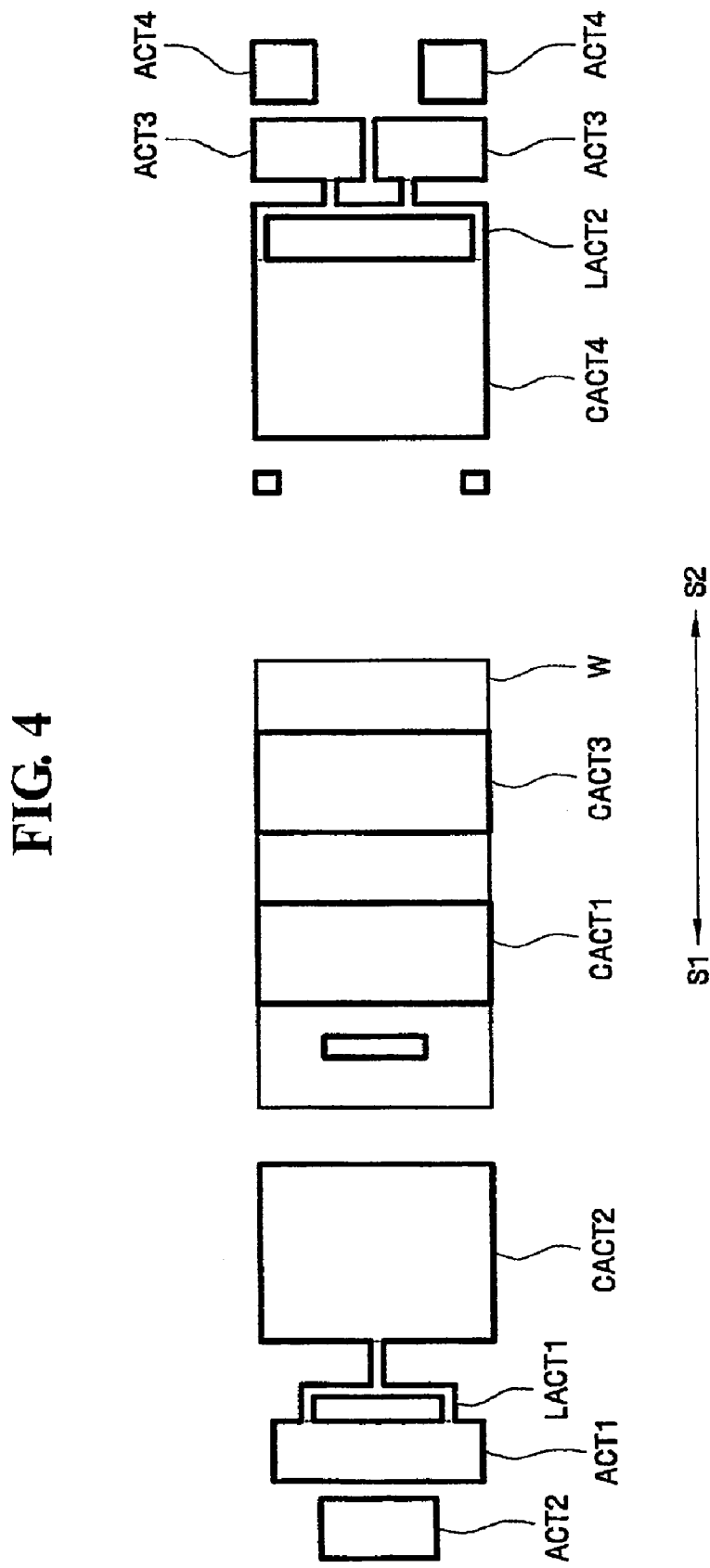
FIG. 4 illustrates a plurality of active regions and a well of the semiconductor memory device illustrated in FIG. 3.
Figure 6A:
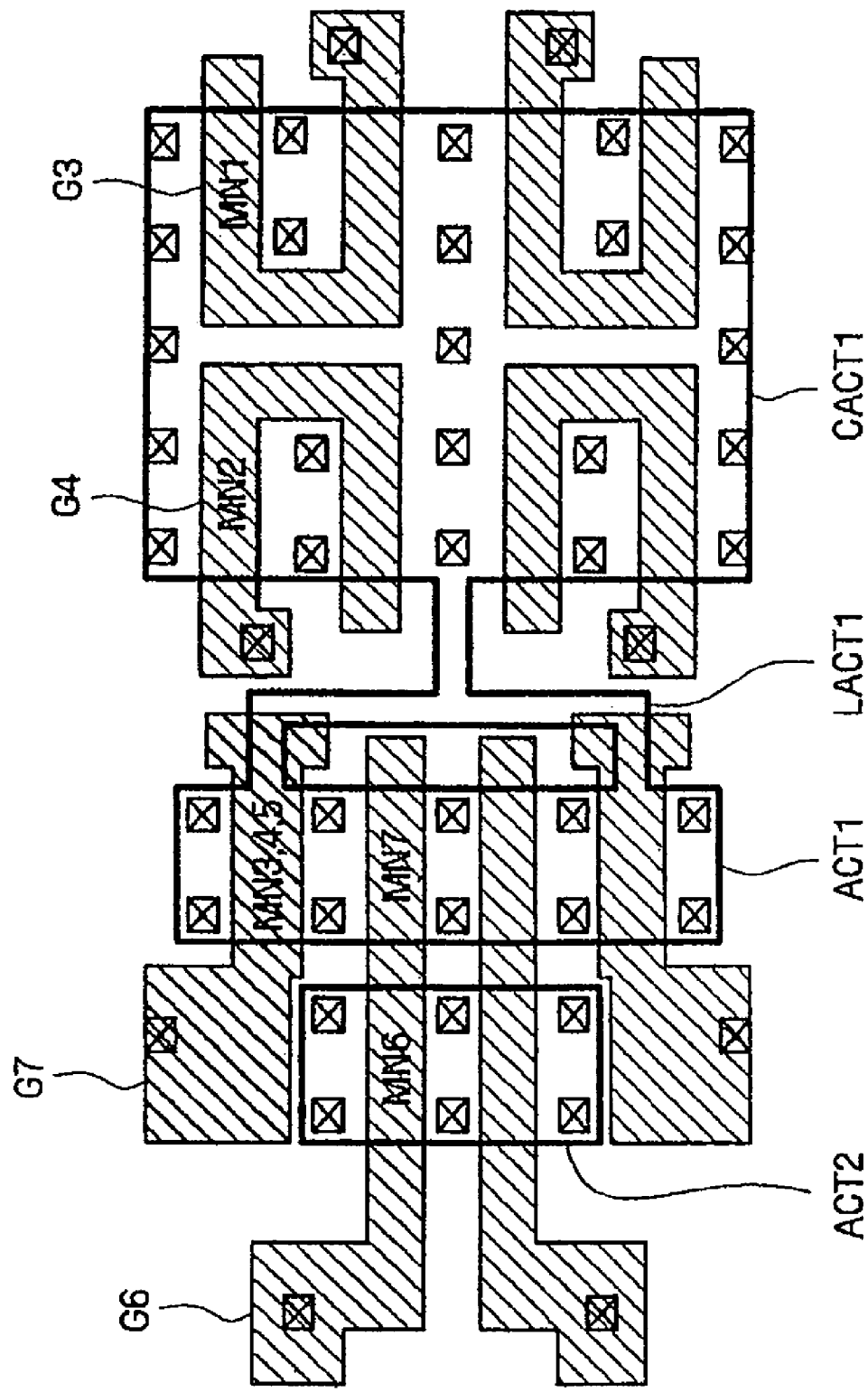
Figure 6C:
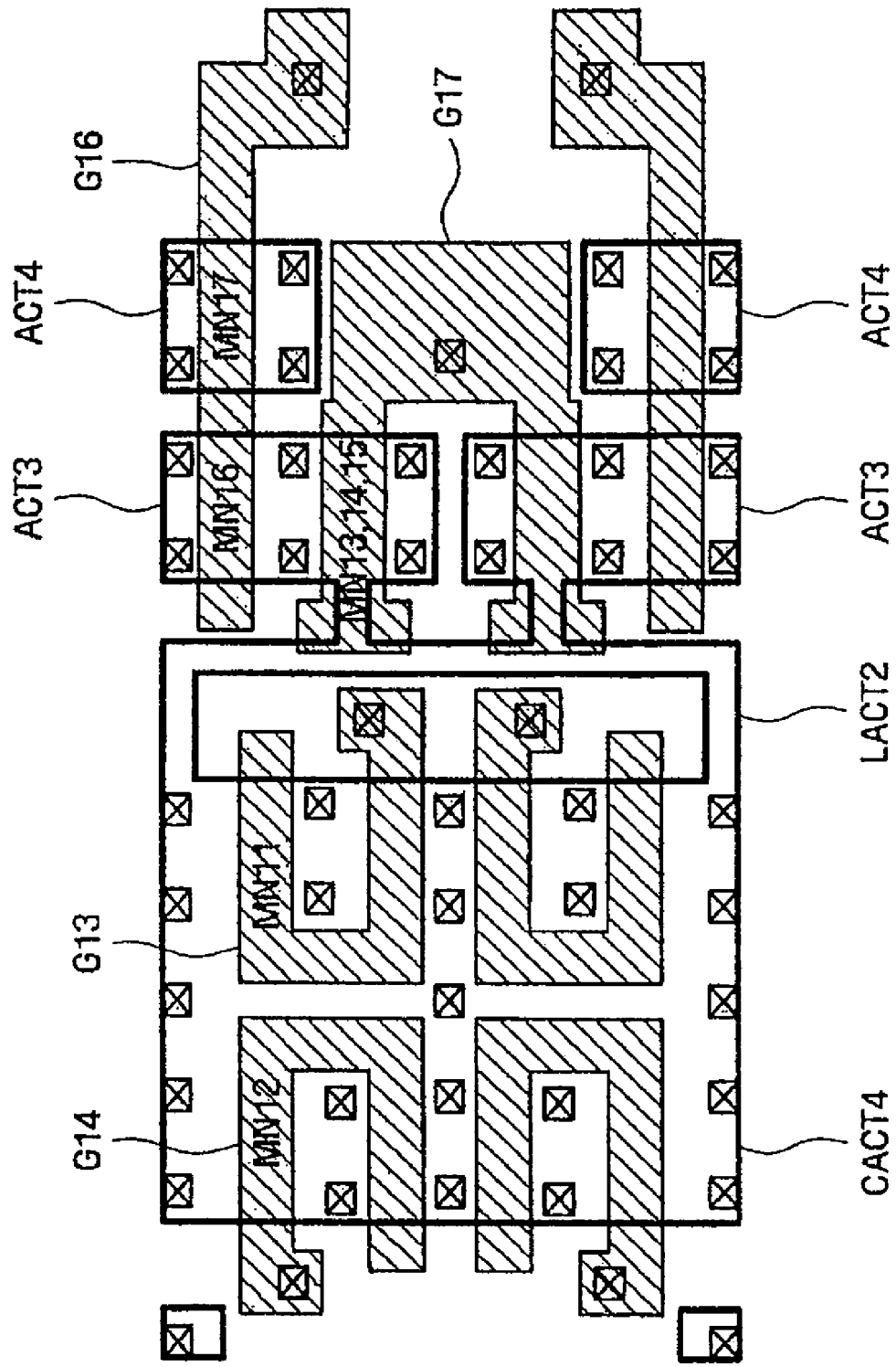
Figure 7:
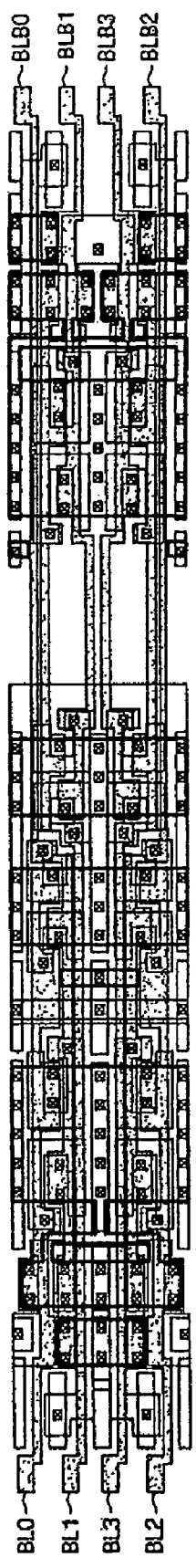
FIG. 7 is a layout of an embodiment of a plurality of sense-circuit regions of a semiconductor memory device according to an aspect of the present invention.
Figure 8:
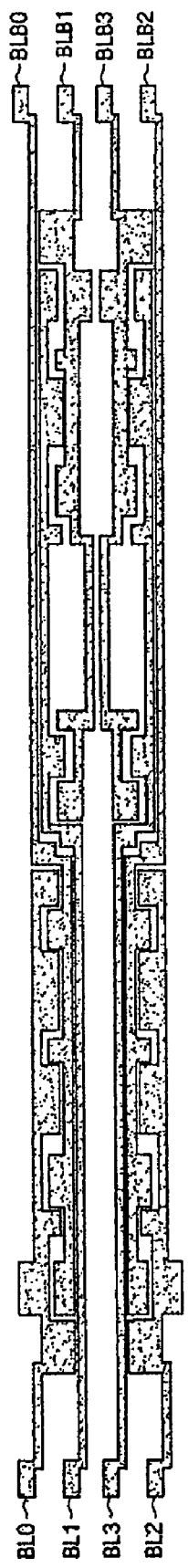
FIG. 8 illustrates a plurality of bitlines and a plurality of complementary bitlines illustrated in FIG. 7.

FIG. 3 is a conceptual arrangement diagram of an embodiment of a plurality of first through fourth sense-circuit regions 200_1 through 200_4 of a semiconductor memory device according to an aspect of the present invention. FIG. 4 illustrates a plurality of actives regions and a well of the semiconductor memory device illustrated in FIG. 3. FIG. 5 illustrates the active regions, the well, a plurality of gates, and a plurality of contacts of the semiconductor memory device illustrated in FIG. 3. FIGS. 6A through 6C are detailed diagrams of FIG. 5. FIG. 7 is a layout of an embodiment of a plurality of sense-circuit regions of a semiconductor memory device according to an aspect of the present invention. FIG. 8 illustrates bitlines BL0 through BL2 and complementary bitlines BLB0 through BLB2 illustrated in FIG. 7.

Referring to FIG. 3, first and second cell array regions (not shown) and the first through fourth sense-circuit regions 200_1 through 200_4 are defined on a substrate. Specifically, when the first memory-cell array region is disposed on a first side S1 (e.g., on a left side) and the second memory-cell array region is disposed on a second side S2 (e.g., on a right side), the first through fourth sense-circuit regions 200_1 through 200_4 are disposed between the first memory-cell array region and the second memory-cell array region, the first and third sense-circuit regions 200_1 and 200_3 are disposed on the first side S1, and the second and fourth sense-circuit regions 200_2 and 200_4 are disposed on the second side S2.

The first through fourth sense-circuit regions 200_1 through 200_4 can include P-type sense amplifier regions 210_1 through 210_4, respectively, N-type sense amplifier regions 220_1 through 220_4, respectively, equalizer regions 230_1 through 230_4, respectively, and column selector regions 240_1 through 240_4, respectively. Referring to FIG.

3, the N-type sense amplifier region 220_1, the P-type sense amplifier region 210_1, the P-type sense amplifier region 210_2 and the N-type sense amplifier region 220_2 are sequentially arranged along a direction from the first side S1 to the second side S2, the N-type sense amplifier region 220_3, the P-type sense amplifier region 210_3, the P-type sense amplifier region 210_4 and the N-type sense amplifier region 220_4 are sequentially arranged along the direction from the first side S1 to the second side S2. However, the present invention is not restricted to this number or arrangement of regions. That is, the P-type sense amplifier regions 210_1 through 210_4, the N-type sense amplifier regions 220_1 through 220_4, the equalizer regions 230_1 through 230_4, and the column selector regions 240_1 through 240_4 can be arranged in various manners, other than that illustrated in FIG. 3.

The P-type sense amplifier regions 210_1 through 210_4, the N-type sense amplifier regions 220_1 through 220_4, the equalizer regions 230_1 through 230_4, and the column selector regions 240_1 through 240_4 are simply regions in which functional blocks can be formed, and thus do not imply that active regions in which functional blocks are formed are all isolated from one another. That is, the P-type sense amplifier regions 210_1 through 210_4, the N-type sense amplifier regions 220_1 through 220_4, the equalizer regions 230_1 through 230_4, and the column selector regions 240_1 through 240_4 are obtained by dividing the first through fourth sense-circuit regions 200_1 through 200_4 functionally, rather than physically. Specifically, referring to FIGS. 4 through 7, different functional blocks (e.g., an equalizer transistor and a column-selection transistor) can be formed in the same active region, and the same functional blocks (e.g., a P-type sense amplifier of a first sense circuit and a P-type sense amplifier of a second sense circuit) belonging to different sense circuits can be formed in the same active region.

Referring to FIG. 4, first through fourth common active regions CACT1 through CACT4, first through fourth active regions ACT1 through ACT4, and first and second connection active regions LACT1 and LACT2 are defined on a substrate of the first conductivity type. The first connection active region LACT1 connects the first active region ACT1 and the second common active region CACT2, and the second connection active region LACT2 connects the third active region ACT3 and the fourth common active region CACT4. The first and third common active regions CACT1 and CACT3 can both be defined in a well of the second conductivity type. The second common active region CACT2, the first common active region CACT1, the third common active region CACT3, and the fourth common active region CACT4 are sequentially disposed along the direction from the first side S1 to the second side S2, but the present invention is not restricted to this.

Referring to FIGS. 2, 5, and 6A through 6C, a plurality of sensing transistors can be formed in the first through fourth common active regions CACT1 through CACT4, respectively. Specifically, the sensing transistors MP1 and MP2 of the first conductivity type, which constitute the P-type sense amplifier 110_1, are formed in the first common active region CACT1, the sensing transistors MN1 and MN2 of the second conductivity type, which constitute the N-type sense amplifier 120_1, are formed in the second common active region CACT2, the sensing transistors MP11 and MP12 of the first conductivity type, which constitute the P-type sense amplifier 110_2, are formed in the third common active region CACT3, and the sensing transistors MN11 and MN12 of the second conductivity type, which constitute the N-type sense amplifier 120_2, are formed in the fourth common active region CACT4.

Since the first and third common active regions CACT1 and CACT3 are defined in the same well, i.e., a well W, the P-type sense amplifiers 110_1 through 110_4 are all formed in the well W, thereby reducing the layout area of a semiconductor memory device compared to the situation when the P-type sense amplifiers 110_1 through 110_4 are formed in different wells.

Gates G1, G2, G11, and G12 of the sensing transistors MP1, MP2, MP11, and MP12 and gates G3, G4, G13, and G14 of the sensing transistors MN1, MN2, MN11, and MN12 are not straight, but curved, i.e., extending in more than one direction (e.g., in a C, U, or G shape). As a result, the drains of the sensing transistors MP1 and MP2, MP11 and MP12, MN1 and MN2, and MN11 and MN12 are isolated, and the sensing transistors MP1 and MP2, MP11 and MP12, MN1 and MN2, and MN11 and MN12 share sources. The sources in the first and third common active regions CACT1 and CACT3, respectively, can be coupled to the voltage line LA, and the sources in the second and fourth common active regions CACT2 and CACT4, respectively, can be coupled to the voltage line LAB.

Since a pair of sensing transistors that constitute a single P-type sense amplifier, e.g., the sensing transistors MP1 and MP2 of the P-type sense amplifier 110_1, are both formed in the first common active region CACT1, the sensing transistors MP1 and MP2 are located very close to each other. Likewise, since a pair of sensing transistors that constitute a single N-type sense amplifier, e.g., the sensing transistors MN1 and MN2 of the N-type sense amplifier 120_1, are both formed in the second common active region CACT2, the sensing transistors MN1 and MN2 are located very close to each other.

A column selector transistor is formed in the first through fourth active regions ACT1 through ACT4, respectively. Specifically, a column-selection transistor MN7 of the second conductivity type is formed in the first active region ACT1, a column-selection transistor MN6 of the second conductivity type is formed in the second active region ACT2, a column-selection transistor MN16 of the second conductivity type is formed in the third active region ACT3, and a column-selection transistor MN17 of the second conductivity type is formed in the fourth active region ACT4.

According to the embodiment of FIGS. 2 through 9, the first and second active regions ACT1 and ACT2 are disposed horizontally adjacent to each other with no other active regions interposed therebetween so that two column-selection transistors (e.g., the column-selection transistors MN6 and MN7) respectively formed in the first and second active regions ACT1 and ACT2 can be located proximate to each other. Also, according to the embodiment of FIGS. 2 through 9, the column-selection transistors MN6 and MN7 can both be coupled to each other via a common gate G6 which extends across the first and second active regions ACT1 and ACT2. As a result, the column-selection transistors MN6 and MN7 are located very close to each other.

The equalizing transistors MN3, MN4, and MN5 of the second conductivity type can also be formed in the area of the first active region ACT1 and the connection active region LACT1, and the equalizing transistors MN13, MN14, and MN15 of the second conductivity type can also be formed in the area of the third active region ACT3 and the connection active region LACT2. The equalizing transistors MN3, MN4, and MN5 can be coupled to one another via a common gate G7, and the equalizing transistors MN13, MN14, and MN15 can be coupled to one another via a common gate G17.

Since the connection active region LACT1 connects the second common active region CACT2 and the first active region ACT1, the voltage line LAB is coupled to the equalizing transistors MN3 and MN4. Likewise, since the connection active region LACT2 connects the fourth common active region CACT4 and the second active region ACT2, the voltage line LAB is coupled to the equalizing transistors MN13 and MN14.

Referring to FIGS. 2, 5, 7 and 8, the bitlines BL0 and BL2, respectively, extend to the first and third sense-circuit regions 200_1 and 200_3, and the bitlines BL1 and BL3, respectively, extend across the first and third sense-circuit regions 200_1 and 200_3 to the second and fourth sense regions 200_2 and 200_4.

Each of the bitlines BL0 through BL3 and the complementary bitlines BLB0 through BLB3 can include a single conductive line which is formed of, for example, polysilicon, metal silicide, or a metal. In this case, the bitlines BL0 through BL3 and the complementary bitlines BLB0 through BLB3 can have a uniform resistance.

According to the embodiment of FIGS. 2 through 9 two column-selection transistors, e.g., the column-selection transistors MN6 and MN7, are disposed adjacent to each other, two sensing transistors that constitute a P-type sense amplifier, e.g., the sensing transistors MP1 and MP2 of the P-type sense amplifier 110_1, are formed in the same common active region (i.e., the first common active region CACT1), and two sensing transistors that constitute an N-type sense amplifier, e.g., the sensing transistors MN1 and MN2 of the N-type sense amplifier 120_1, are formed in the same active region (i.e., the second common active region CACT2). As a result, the sensing transistors MN1 and MN2 are located very close to each other. Therefore, sensitivity of sensing can increase.

Figure 9:
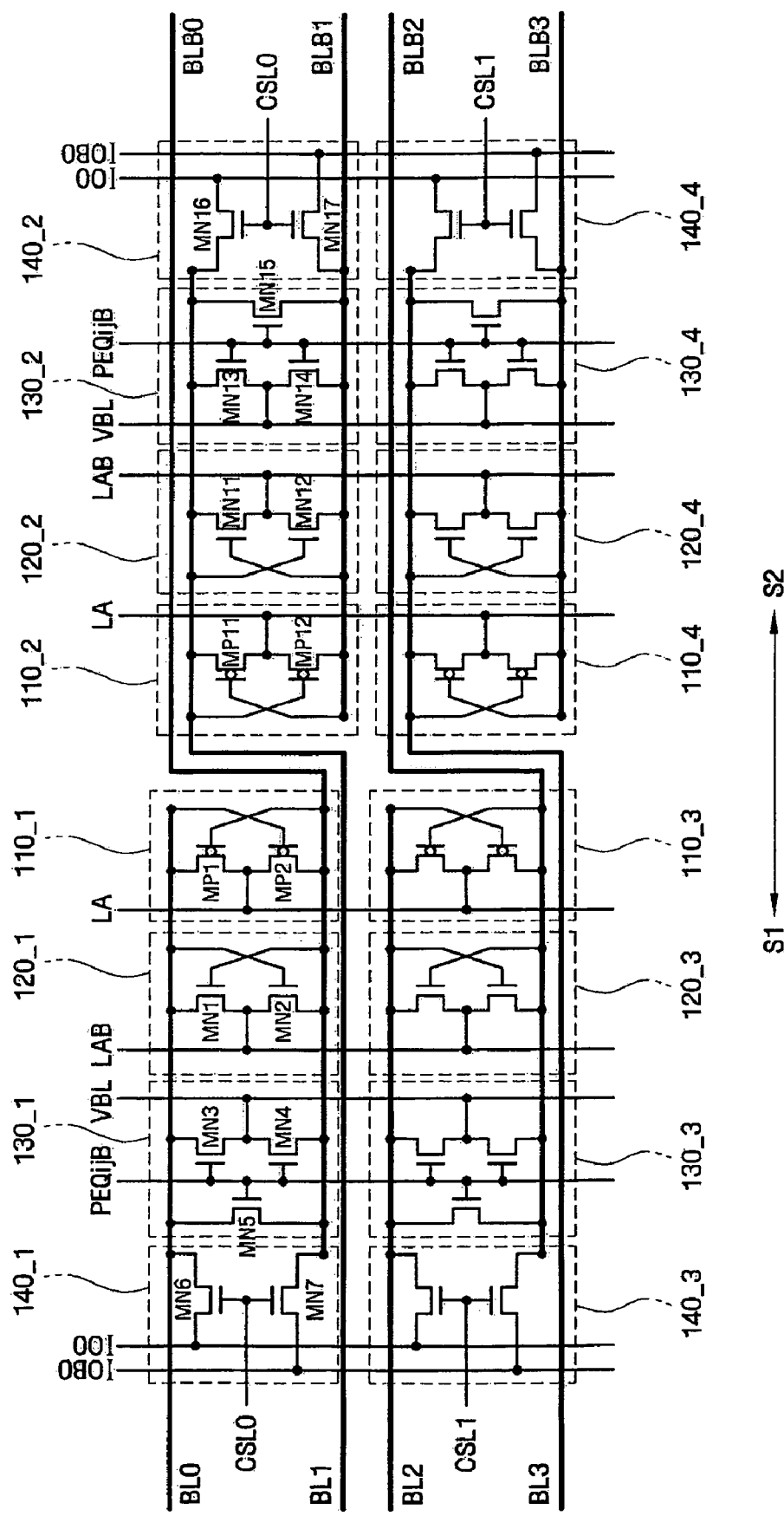
FIG. 9 is another embodiment of a circuit diagram of a plurality of sense-circuit regions of a semiconductor memory device according to aspects of the present invention.

FIG. 9 is a circuit diagram of an embodiment of a plurality of sense circuits of a semiconductor memory device according to another aspect of the present invention. In FIGS. 2 through 8, like reference numerals indicate like elements, and, thus, detailed descriptions thereof will be skipped.

The semiconductor memory device of the embodiment of FIG. 9 is different from the semiconductor memory device of the embodiment of FIGS. 2 through 8 in that equalizers 131_1 through 131_4 are coupled to a different voltage line than the N-type sense amplifiers 121_1 through 121_4. Specifically, the equalizers 131_1 are coupled to a voltage line VBL, whereas the N-type sense amplifiers 121_1 through 121_4 are coupled to a voltage line LAB. The semiconductor memory device of the embodiment of FIG. 9 can have almost the same layout as that illustrated in FIG. 5. In this case, the layout area of the semiconductor memory device of the embodiment of FIG. 9 can be larger than that of the semiconductor memory device of the embodiment of FIGS. 2 through 8.

Figure 10:
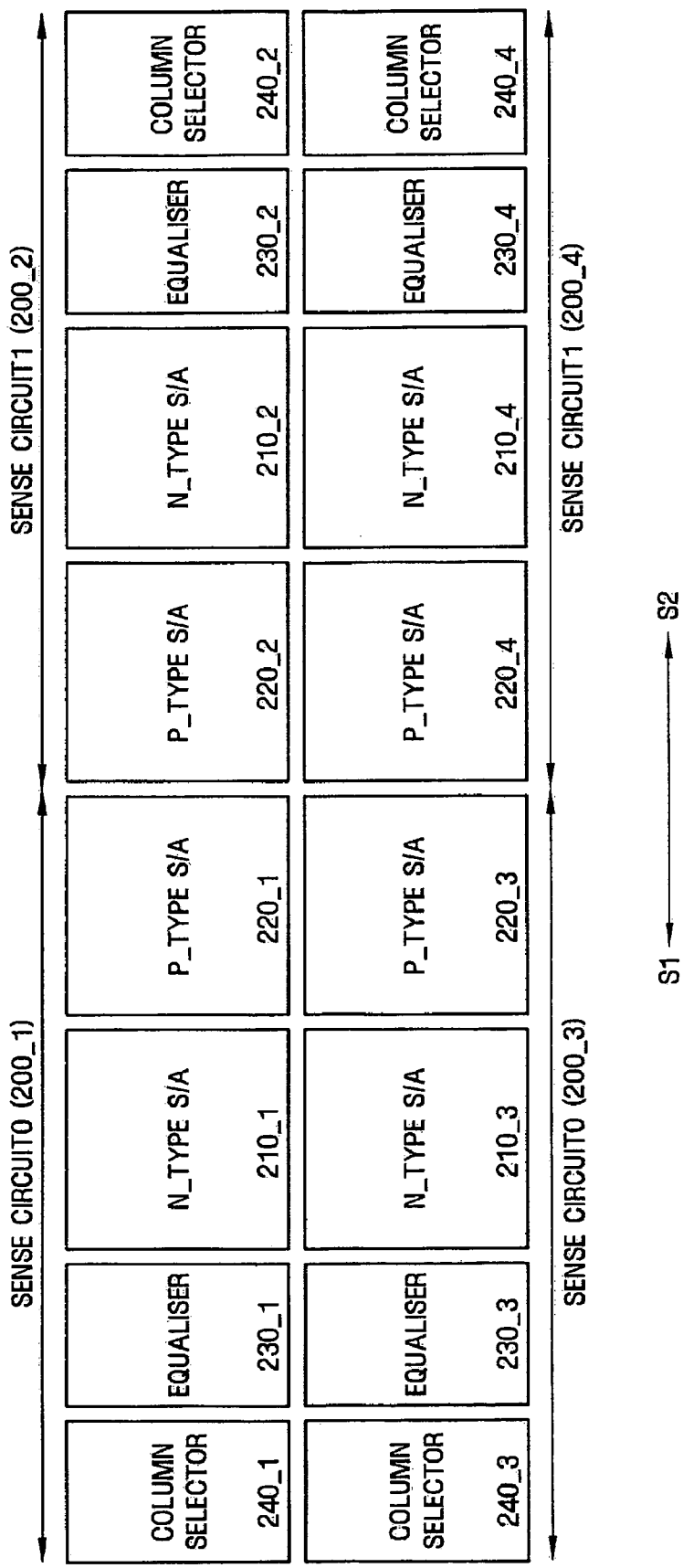
FIG. 10 is a conceptual arrangement diagram of an embodiment of a plurality of sense-circuit regions of a semiconductor memory device according to another aspect of the present invention.

FIG. 10 is an embodiment of a conceptual arrangement diagram of a plurality of sense circuits of a semiconductor memory device according to aspect of the present invention. In FIGS. 2 through 8, like reference numerals indicate like elements, and, thus, detailed descriptions thereof will be skipped.

The semiconductor memory device of the embodiment of FIG. 10 is different from the semiconductor memory device of the embodiment of FIGS. 2 through 8 in that a P-type sense amplifier region 210_1, an N-type sense amplifier region 220_1, an N-type sense amplifier region 220_2, and a P-type sense amplifier region 210_2 are sequentially arranged along a direction from a first side S1 to a second side S2, and that a P-type sense amplifier region 210_3, an N-type sense amplifier region 220_3, an N-type sense amplifier region 220_4, and a P-type sense amplifier region 210_4 are sequentially arranged along the direction from the first side S1 to the second side S2. Thus, the P-type sense amplifiers 210_1 and 210_3 are isolated from the P-type sense amplifiers 210_2 and 210_4, and thus do not share a well of a second conductivity type. Therefore, the layout area of the semiconductor memory device of the embodiment of FIG. 10 can be larger than the layout area of the semiconductor memory device of the embodiment of FIGS. 2 through 8.

As described above, according to the present invention, the sensitivity of a sensing operation increases.

While aspects of the present invention have been particularly shown and described with reference to exemplary embodiments thereof, it will be understood by those of ordinary skill in the art that various changes may be made in the form and details without departing from the spirit and scope of the present invention as defined by the following claims.

What is claimed is:

1. A semiconductor memory device comprising:
a substrate on which first and second memory-cell array regions and first and second sense-circuit regions are defined, the first memory-cell array region being disposed on a first side of the substrate, the second memory-cell array region being disposed on a second side of the substrate, the first and second sense-circuit regions being disposed between the first and second memory-cell array regions, the first sense-circuit region being disposed on the first side, and the second sense-circuit region being disposed on the second side;
first and second bitlines coupled to a plurality of memory cells in the first memory-cell array region;
first and second complementary bitlines coupled to a plurality of memory cells in the second memory-cell array region;
first and second column-selection transistors formed in the first sense-circuit region, and configured to selectively couple the first bitline and the first complementary bitline to a first input/output (I/O) line and a first complementary I/O line; and
third and fourth column-selection transistors formed in the second sense-circuit region, and configured to selectively couple the second bitline and the second complementary bitline to a second I/O line and a second complementary I/O line.

2. The semiconductor memory device of claim 1, wherein the first sense-circuit region includes first and second active regions, the first active region including the first column-selection transistor, and the second active region including the second column-selection transistor.

3. The semiconductor memory device of claim 2, wherein the first and second column-selection transistors are coupled to each other via a common gate which extends across the first and second active regions.

4. The semiconductor memory device of claim 2, wherein the first active region includes an equalizing transistor configured to equalize a voltage of the first bitline and a voltage of the first complementary bitline.

5. The semiconductor memory device of claim 1, wherein the first sense-circuit region includes a first common active region, the first common active region including a plurality of sensing transistors of a first conductivity type which constitute a first sense amplifier.

6. The semiconductor memory device of claim 5, wherein the first sense-circuit region includes a second common active region, the second common active region including a plurality of sensing transistors of a second conductivity type which constitute a second sense amplifier.

7. The semiconductor memory device of claim 6, wherein the first sense-circuit region includes a first active region and a connection active region which connects the first active region and the second common active region, the first active region and the connection active region including an equalizing transistor configured to equalize a voltage of the first bitline and a voltage of the first complementary bitline.

8. The semiconductor memory device of claim 1, wherein:
the first sense-circuit region includes first and second common active regions, the first common active region including a plurality of sensing transistors of a first conductivity type which constitute a first sense amplifier, and the second common active region including a plurality of sensing transistors of a second conductivity type which constitute a second sense amplifier; and
the second sense-circuit region includes third and fourth common active regions, the third common active region including a plurality of sensing transistors of the first conductivity type which constitute a third sense amplifier, and the fourth common active region including a plurality of sensing transistors of the second conductivity type which constitute a fourth sense amplifier.

9. The semiconductor memory device of claim 8, wherein the second common active region, the first common active region, the third common active region, and the fourth common active region are sequentially arranged.

10. The semiconductor memory device of claim 8, wherein the first common active region and the third common active region are both disposed in a well of the second conductivity type.

11. The semiconductor memory device of claim 1, wherein the first bitline extends to the first sense-circuit region and the first complementary bitline extends across the second sense-circuit region to the first sense-circuit region.

12. The semiconductor memory device of claim 1, wherein the second bitline extends across the first sense-circuit region to the second sense-circuit region, and the second complementary bitline extends to the second sense-circuit region.

13. The semiconductor memory device of claim 1, wherein the first through fourth column-selection transistors are configured to operate in response to the same column selection signal.

14. A semiconductor memory device comprising:
a substrate on which first and second memory-cell array regions and first and second sense-circuit regions are defined, the first memory-cell array region being disposed on a first side of the substrate, the second memory-cell array region being disposed on a second side of the substrate, the first and second sense-circuit regions being disposed between the first and second memory-cell array regions, the first sense-circuit region being disposed on the first side, and the second sense-circuit region being disposed on the second side;
first and second bitlines coupled to a plurality of memory cells in the first memory-cell array region;
first and second complementary bitlines coupled to a plurality of memory cells in the second memory-cell array region;
a first sense amplifier formed in the first sense-circuit region, comprising a plurality of sensing transistors of a first conductivity type and is configured to amplify a difference between a voltage of the first bitline and a voltage of the first complementary bitline; and
a second sense amplifier formed in the second sense-circuit region, comprising a plurality of sensing transistors of the first conductivity type, and is configured to amplify a difference between a voltage of the second bitline and a voltage of the second complementary bitline,
wherein the first sense amplifier and the second sense amplifier are both formed in a well of a second conductivity type.

15. The semiconductor memory device of claim 14, further comprising:
a third sense amplifier formed in the first sense-circuit region, comprising a plurality of sensing transistors of a second conductivity type and configured to amplify the difference between the voltage of the first bitline and the voltage of the first complementary bitline; and
a fourth sense amplifier formed in the second sense-circuit region, comprising a plurality of sensing transistors of the second conductivity type, and configured to amplify the difference between the voltage of the second bitline and the voltage of the second complementary bitline,
wherein the third sense amplifier is disposed on the first side with the first sense amplifier, and the fourth sense amplifier is disposed on the second side with the second sense amplifier.

16. The semiconductor memory device of claim 14, further comprising:
first and second column-selection transistors formed in the first sense-circuit region, and configured to selectively couple the first bitline and the first complementary bitline to a first I/O line and a first complementary I/O line; and
third and fourth column-selection transistors formed in the second sense-circuit region, and configured to selectively couple the second bitline and the second complementary bitline to a second I/O line and a second complementary I/O line.

17. A semiconductor memory device comprising:
a substrate on which first and second memory-cell array regions and first and second sense-circuit regions are defined, the first memory-cell array region being disposed on a first side of the substrate, the second memory-cell array region being disposed on a second side of the substrate, the first and second sense-circuit regions being disposed between the first and second memory-cell array regions, the first sense-circuit region being disposed on the first side of the substrate, and the second sense-circuit region being disposed on the second side of the substrate;
first and second bitlines coupled to a plurality of memory cells in the first memory-cell array region;
first and second complementary bitlines coupled to a plurality of memory cells in the second memory-cell array region;
a first sense amplifier comprising a plurality of sensing transistors of a first conductivity type formed in a first common active region in the first sense-circuit region, the first sense amplifier configured to amplify a difference between a voltage of the first bitline and a voltage of the first complementary bitline; and
a second sense amplifier comprising a plurality of sensing transistors of the first conductivity type formed in a second common active region in the second sense-circuit region, the second sense amplifier configured to amplify a difference between a voltage of the second bitline and a voltage of the second complementary bitline.

18. The semiconductor memory device of claim 17, further comprising:

a third sense amplifier comprising a plurality of sensing transistors of a second conductivity type formed in a third common active region in the first sense-circuit region, the third sense amplifier configured to amplify the difference between the voltage of the first bitline and the voltage of the first complementary bitline; and a fourth sense amplifier comprising a plurality of sensing transistors of the second conductivity type formed in a fourth common active region in the second sense-circuit region, the fourth sense amplifier configured to amplify the difference between the voltage of the second bitline and the voltage of the second complementary bitline.

19. The semiconductor memory device of claim 17, further comprising:

first and second column-selection transistors formed in the first sense-circuit region, and configured to selectively couple the first bitline and the first complementary bitline to a first I/O line and a first complementary I/O line; and third and fourth column-selection transistors formed in the second sense-circuit region, and configured to selectively couple the second bitline and the second complementary bitline to a second I/O line and a second complementary I/O line.

20. A semiconductor memory device comprising:
a bitline and a complementary bitline;
a voltage line;
a sense amplifier comprising a first sensing transistor that is coupled between the bitline and the voltage line and a second sensing transistor that is coupled between the complementary bitline and the voltage line;
an equalizer comprising a first equalizing transistor that is coupled between the bitline and the voltage line and a second equalizing transistor that is coupled between the complementary bitline and the voltage line;
a first active region comprising the first and second sensing transistors;
a second active region comprising the first and second equalizing transistors; and
a connection active region, wherein the first active region is connected with the second active region through the connection active region.

21. The semiconductor memory device of claim 20, wherein the bitline and the complementary bitline are arranged in an open bitline structure.

22. The semiconductor memory device of claim 20, wherein the sense amplifier is an N-type sense amplifier comprising first and second NMOS sensing transistors or a P-type sense amplifier comprising first and second PMOS sensing transistors.

* * * * *